United States Patent
Sukegawa et al.

(10) Patent No.: US 9,842,636 B2
(45) Date of Patent: Dec. 12, 2017

(54) PERPENDICULAR MAGNETIZATION FILM, PERPENDICULAR MAGNETIZATION FILM STRUCTURE, MAGNETORESISTANCE ELEMENT, AND PERPENDICULAR MAGNETIC RECORDING MEDIUM

(71) Applicants: NATIONAL INSTITUTE FOR MATERIALS SCIENCE, Ibaraki (JP); SAMSUNG ELECTRONICS COMPANY LIMITED, Gyeonggi-do (KR)

(72) Inventors: Hiroaki Sukegawa, Ibaraki (JP); Hwachol Lee, Ibaraki (JP); Kazuhiro Hono, Ibaraki (JP); Seiji Mitani, Ibaraki (JP); Tadakatsu Ohkubo, Ibaraki (JP); Jun Liu, Ibaraki (JP); Shinya Kasai, Ibaraki (JP); Kwangseok Kim, Gyeonggi-do (KR)

(73) Assignees: NATIONAL INSTITUTE FOR MATERIALS SCIENCE, Ibaraki (JP); SAMSUNG ELECTRONICS COMPANY LIMITED, Gyeonggi-Do (KR)

( * ) Notice: Subject to any disclaimer, the term of this patent is extended or adjusted under 35 U.S.C. 154(b) by 0 days.

(21) Appl. No.: 15/134,514

(22) Filed: Apr. 21, 2016

(65) Prior Publication Data
US 2016/0314825 A1 Oct. 27, 2016

(30) Foreign Application Priority Data
Apr. 23, 2015 (JP) ................................. 2015-088685

(51) Int. Cl.
*G11C 11/16* (2006.01)
*H01F 10/193* (2006.01)
(Continued)

(52) U.S. Cl.
CPC ........ *G11C 11/161* (2013.01); *H01F 10/1933* (2013.01); *H01L 43/02* (2013.01);
(Continued)

(58) Field of Classification Search
None
See application file for complete search history.

(56) References Cited

U.S. PATENT DOCUMENTS

| 3,735,373 A * | 5/1973 | Barberon | .......... G11B 11/10504 252/62.51 R |
| 2012/0088125 A1* | 4/2012 | Nishiyama | ............. B82Y 25/00 428/828 |

(Continued)

FOREIGN PATENT DOCUMENTS

JP 2009054776 A * 3/2009

OTHER PUBLICATIONS

JPO Abstract Translation of JP 2009-054776 A (pub. 2009).*
(Continued)

*Primary Examiner* — Kevin M Bernatz
(74) *Attorney, Agent, or Firm* — Wenderoth, Lind & Ponack, L.L.P.

(57) ABSTRACT

Provided is a structure having a perpendicular magnetization film which is an $(Mn_{1-x}Ga_x)_4N_{1-y}$ ($0<x\leq0.5$, $0<y<1$) thin film having a nitrogen-deficient composition which is formed by controlling and introducing nitrogen N into an MnGa alloy or a thin film containing at least one of Ge, Zn, Sb, Ni, Ag, Sn, Pt, and Rh, instead of Ga. The perpendicular magnetization film exhibits a Curie temperature sufficiently higher than room temperature, has saturation magnetization smaller than that of existing materials, and is capable of being fabricated as a very flat film.

12 Claims, 11 Drawing Sheets

(51) Int. Cl.
H01L 43/02 (2006.01)
H01L 43/08 (2006.01)
H01L 43/10 (2006.01)
H01L 43/12 (2006.01)

(52) U.S. Cl.
CPC .............. *H01L 43/08* (2013.01); *H01L 43/10* (2013.01); *H01L 43/12* (2013.01)

(56) References Cited

U.S. PATENT DOCUMENTS

| | | | | |
|---|---|---|---|---|
| 2013/0037862 | A1* | 2/2013 | Kitagawa | H01L 43/08 257/252 |
| 2015/0188034 | A1* | 7/2015 | Takahashi | H01L 43/02 257/421 |
| 2015/0348684 | A1* | 12/2015 | Sugimoto | C23C 8/02 335/296 |
| 2016/0148975 | A1* | 5/2016 | Kato | H01L 43/08 257/427 |

OTHER PUBLICATIONS

K. Yakushiji, A. Fukushima, H. Kubota, M. Konoto, and S. Yuasa, "Ultralow-Voltage Spin-Transfer Switching in Perpendicularly Magnetized Magnetic Tunnel Junctions with Synthetic Antiferromagnetic Reference Layer," Appl. Phys. Express, vol. 6, No. 11, p. 113006 (2013).

Mizukami, F. Wu, A. Sakuma, J. Walowski, D.Watanabe, T. Kubota, X. Zhang, H. Naganuma, M. Oogane, Y. Ando, and Miyazaki, "Long-Lived Ultrafast Spin Precession in Manganese Alloys Films with a Large Perpendicular Magnetic isotropy," Phys. Rev. Lett., vol. 106, No. 11, p. 117201 (2011).

D. Fruchart and E. F. Bertaut, "Magnetic Studies of the Metallic Perovskite-Type Compounds of Manganese", J. Phys. Soc. Jpn., vol. 44, No. 3, pp. 781-791 (1978).

* cited by examiner (a)

(b)

PERPENDICULAR MAGNETIZATION FILM, PERPENDICULAR MAGNETIZATION FILM STRUCTURE, MAGNETORESISTANCE ELEMENT, AND PERPENDICULAR MAGNETIC RECORDING MEDIUM

TECHNICAL FIELDS

The present invention relates to a ferromagnetic perpendicular magnetization film and a perpendicular magnetization film structure. Also, the present invention relates to a magnetoresistance element and a perpendicular magnetic recording medium, which use the perpendicular magnetization film structure.

BACKGROUND ART

With the development of the large capability of magnetic storages and memory devices represented by magnetic disk devices (hard disks) or non-volatile random access magnetic memories (MRAM), use of a perpendicular magnetization film which is magnetized in a film perpendicular-to-plane direction as an information recording layer has been spotlighted. In addition, in order to improve a recording density of a hard disk and MRAM due to miniaturization of configuration recording bits of a hard disk recording medium or a tunnel magnetoresistance element (magnetic tunnel junction (MTJ) element) using the perpendicular magnetization, there is a need for a perpendicular magnetization material of which a magnetic anisotropy energy density Ku is high. In particular, for the MTJ element, it is required that saturation magnetization is small and a flat film structure is easily fabricated, in addition to the high Ku. The low saturation magnetization for the films is important to reduce modification of MTJ element characteristics or influence on adjacent elements due to leakage field from perpendicular magnetization film dots. Preparation of the flat film structure is important to reduce variation of each MTJ element having a multilayer film structure. In addition, when the perpendicular film is used as an information recording layer of the MTJ element for MRAM, reduction of power consumption for information writing using an electric current through the MTJ element (spin-transfer torque (STT) writing) is the major issue. For this purpose, it is required that a magnetic damping constant of the perpendicular magnetization film is small. Of cause, it is required that such a perpendicular magnetization film has a ferromagnetic transition temperature (Curie temperature) sufficiently higher than room temperature.

Until now, as the perpendicular magnetization film of the perpendicular magnetic recording medium, for example, Co-based alloy material, such as a cobalt-platinum-chrome (Co—Pt—Cr) alloy, has been known. Also, WO 2014/004398 A1 uses an $L1_0$ type iron-platinum (FePt) alloy from which a very high Ku is acquired. In K. Yakushiji, A. Fukushima, H. Kubota, M. Konoto, and S. Yuasa, "Ultralow-Voltage Spin-Transfer Switching in Perpendicularly Magnetized Magnetic Tunnel Junctions with Synthetic Antiferromagnetic Reference Layer," Appl. Phys. Express, Vol. 6, No. 11, p 113006 (2013), as the MTJ element, a film acquired by alternately laminating Co atomic layers and Pt ones is used as a perpendicular magnetization film, which is a structure that applies a high Ku which a CoPt alloy has.

However, as described above, there are problems that existing perpendicular magnetization material contains an expensive noble metal, and magnetic damping is generally large. On the other hand, a manganese-gallium alloy of which magnetic damping is small without using a noble metal is a candidate of a perpendicular magnetization film (S. Mizukami, F. Wu, A. Sakuma, J. Walowski, D. Watanabe, T. Kubota, X. Zhang, H. Naganuma, M. Oogane, Y. Ando, and T. Miyazaki, "Long-Lived Ultrafast Spin Precession in Manganese Alloys Films with a Large Perpendicular Magnetic Anisotropy," Phys. Rev. Lett., Vol. 106, No. 11, p. 117201 (2011)). However, since the manganese-gallium alloy material has a complex crystal structure belonging to a tetragonal crystal system, i.e. $DO_{22}$ type or $L1_0$ type structure, a high formation temperature is required in order to obtain a film having a desired crystal structure. Therefore, there is a problem that it is hard to fabricate a flat film, and therefore, it is difficult to archive a high quality of a recording medium or MTJ element using the film.

SUMMARY OF INVENTION

Problems to be Solved by the Invention

In view of those facts, objects of the present invention are to provide a perpendicular magnetization film which has a relatively simple crystal structure and can be fabricated to be flat, a perpendicular magnetization film structure, a perpendicular MTJ element using the perpendicular magnetization film structure, by considering an MnGa alloy having a low damping constant as an application to an MTJ element for MRAM.

Means for Solving the Problems

During a process of conducting research for an MnGa alloy-based perpendicular magnetization film, the present inventors have found that a uniform nitride Mn—Ga—N is formed by using a reactive sputtering method in which a small amount of nitrogen is introduced during sputtering film deposition of an MnGa film, and in particular, when the N ratio is small, it exhibits ferromagnetic characteristics and becomes a perpendicular magnetization film. Although an $Mn_3GaN$ perovskite-type compound has been known as nitride of MnGa, it exhibits parametric or antiferromagnetic characteristics at room temperature and does not become a perpendicular magnetization film inherently because the compound does not show spontaneous magnetization (D. Fruchart and E. F. Bertaut, "Magnetic Studies of the Metallic Perovskite-Type Compounds of Manganese", J. Phys. Soc. Jpn, Vol. 44, No. 3, pp. 781-791 (1978)). However, it was found that MnGaN has a perovskite type structure, a different crystal structure from MnGa having a composition containing no N. In addition, this perovskite structure is stably acquired even when an N element ratio is less than 20% that is a stoichiometric composition of $Mn_3GaN$. At the same time, it was found that the Mn—Ga—N perpendicular magnetization film is formed to be extremely flat as compared to the MnGa film case, resulting in the present invention. Also, it was found that it is expected that the same effect is acquired even in a case in which various transition metal elements are contained instead of Ga, leading to completion of the present invention.

That is, the present invention first provides a novel perpendicular magnetization film. The perpendicular magnetization film has a perovskite type crystal structure having a composition expressed as:

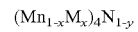

(M represents at least one or two or more of metal elements Ga, Ge, Zn, Sb, Ni, Ag, Sn, Pt, and Rh, and $0<x\leq0.5$ and $0<y\leq1$). The perpendicular magnetization film is an Mn—Ga—N compound film having a crystal structure having an Mn₃GaN perovskite type (E2₁ type) as a prototype, and an element ratio of N has a nitrogen-deficient composition and exhibits a ferromagnetic characteristics and perpendicular magnetization at room temperature.

Also, the present invention provides a novel perpendicular magnetization film structure having the perpendicular magnetization film on a substrate, or through an underlayer as a non-magnetic layer or an electric conductive layer on the substrate. In the structure, a non-magnetic layer may be further disposed on the perpendicular magnetization film layer. Furthermore, the present invention provides a novel perpendicular tunnel magnetoresistance (MTJ) element structure in which, on a substrate or an underlayer as a non-magnetic layer or an electric conductive layer on the substrate, the perpendicular magnetization film used as a first perpendicular magnetization layer, a tunnel barrier layer, and a perpendicular magnetization layer which is the same type as or different type from the perpendicular magnetization film as a second perpendicular magnetization layer are laminated. In the perpendicular MTJ element structure, an upper electrode may be disposed on the second perpendicular magnetization layer.

The present invention provides a manufacturing method of the novel perpendicular magnetization film and the perpendicular magnetization film structure. In the manufacturing method, the perpendicular magnetization film is deposited by a vapor deposition method on the substrate. Examples of a vapor deposition method may include a sputtering method, a plasma method, a vacuum evaporation method, and a combination thereof. A preferable method is the sputtering method, in which film deposition is performed using a target material, such as MnGa, substrate heating and a mixture gas of an inert gas, such argon, with an N₂ gas. In this case, the amount of nitrogen derived from the N₂ gas is adjusted.

Effects of the Invention

According to the present invention, it is possible to realize a perpendicular magnetization film having high flatness and low saturation magnetization by using the fact that strong perpendicular magnetization at room temperature is obtained by realizing a homogeneous perpendicular magnetization film of which a nitrogen amount is adjusted, and at the same time, provide a perpendicular magnetization MTJ element using the perpendicular magnetization film.

DETAILED DESCRIPTION OF THE PREFERRED EMBODIMENTS

A perpendicular magnetization film of the present invention has a composition expressed as:

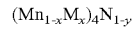

$(0<x\leq0.5, 0<y<1)$, and the metal element M is representatively and preferably Ga (gallium). Substitutes of Ga include Ge, Zn, Sb, Ni, Ag, Sn, Pt, and Rh. Such metal elements are selected because it is well known to form an Mn₃MN having a perovskite type structure (D. Fruchart and E. F. Bertaut, "Magnetic Studies of the Metallic Perovskite-Type Compounds of Manganese", J. Phys. Soc. Jpn, Vol. 44, No. 3, pp. 781-791 (1978)).

A metal element M may be one of the metals including Ga or may be two or more, and it is possible to adjust magnetic characteristics by a composition thereof. The reason for $0<x\leq0.5$ is that an Mn-M before nitriding contains the composition range of an L1₀ type or DO₂₂ type structure. Also, the reason for y<1 is that it improves Curie temperatures and magnetic properties.

The perpendicular magnetization film of the present invention has a nitrogen (N)-deficient composition ratio compared to the Mn₃MN as the above composition. In a case in which a metal element M is Ga, the crystal structure is a perovskite type as a prototype. Also, the crystal structure may be a cubic structure or a tetragonal system depending on a type of the metal element.

The perpendicular magnetization film structure and the perpendicular tunnel magnetoresistance (MTJ) element structure according to the present invention have the above-described perpendicular magnetization film as an essential requirement.

Hereinafter, embodiments of the present invention will be described below in detail by taking, as an example, a perpendicular magnetization film in a case in which the metal element M having the above composition is Ga (gallium).

(A) Basic Structure

Figure 1:
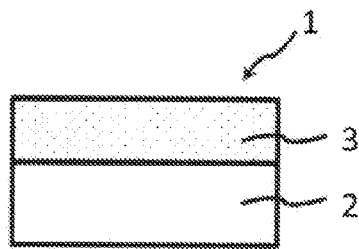
FIG. 1 is a cross-sectional view illustrating a minimum configuration structure of a perpendicular magnetization film structure according to an embodiment of the present invention.
Figure 2:
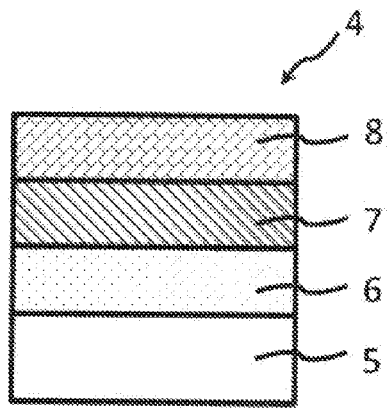
FIG. 2 is a cross-sectional view illustrating a standard configuration structure of a perpendicular magnetization film structure according to an embodiment of the present invention.
Figure 3:
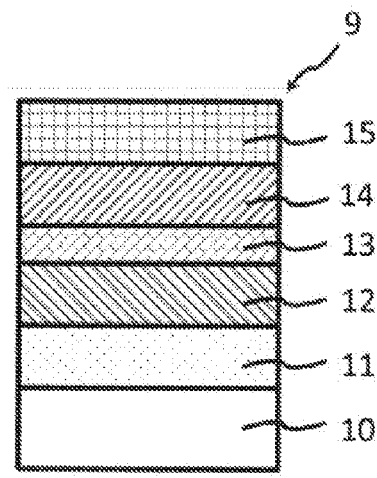
FIG. 3 is a cross-sectional view illustrating a configuration structure of a perpendicular magnetization MTJ element structure according to an embodiment of the present invention.

FIGS. 1, 2 and 3 are schematic diagrams respectively illustrating perpendicular magnetization film structures 1 and 4 and a perpendicular magnetization MTJ element 9 according to embodiments of the present invention.

As illustrated in FIG. 1, the perpendicular magnetization film structure 1 according to an embodiment of the present invention includes a substrate 2 and a perpendicular magnetization film layer 3. For example, the substrate 2 is preferably magnesium oxide (MgO) single crystal with a (001) orientation having a rock-salt (NaCl) structure. Also, as the substrate 2, a polycrystalline MgO film with the (001) orientation may be used, or magnesium-titanium oxide ($MgTiO_x$) having a NaCl structure instead of MgO, $SrTiO_3$ of a perovskite structure, or $MgAl_2O_4$ of a spinel structure may be used.

In the perpendicular magnetization film structure 4 that is an embodiment of the present invention illustrated in FIG. 2, an underlayer 6 functioning as a non-magnetic layer or an electric conductive layer, a perpendicular magnetization film layer 7, and a non-magnetic layer 8 are laminated on the substrate 5 sequentially. The substrate 5 and the perpendicular magnetization film layer 7 have the same meaning as the substrate 2 in FIG. 1 and the perpendicular magnetization film layer 3, respectively. The underlayer 6 functioning as a non-magnetic layer or an electric conductive layer is an electric conductive layer made of, for example, chrome (Cr), platinum (Pt), palladium (Pd), ruthenium (Ru), alloy thereof, or the like, which is subjected to epitaxial growth on the substrate 5. By disposing, for example, an oxide layer, such as MgO, as the non-magnetic layer 8, perpendicular magnetic anisotropy of the perpendicular magnetization layer 3 can be improved. Also, it is possible to use a noble metal layer, such as Ru, that suppresses surface damage due to oxidation, or the like.

FIG. 3 is a schematic diagram illustrating a perpendicular magnetization MTJ structure 9 according to an embodiment of the present invention. The perpendicular magnetization MTJ structure 9 includes a substrate 10, an underlayer 11, a first perpendicular magnetization film layer 12, a non-magnetic layer 13, a second perpendicular magnetization film layer 14, and an upper electrode 15. The substrate 10, the underlayer 11, and the first perpendicular magnetization film layer 12 have the same meaning as the substrate 5, the underlayer 6, and the perpendicular magnetization film layer 7 in FIG. 2. In this case, the underlayer 11 is not necessarily required.

The non-magnetic layer 13 is an oxide layer, and serves as a tunnel barrier in an MTJ element. In addition, the non-magnetic layer 13 also serves to enhance the perpendicular magnetic anisotropy of the first perpendicular magnetization layer 12. Hereinafter, the non-magnetic layer 13 is referred to as a tunnel barrier layer. As a composition material of the tunnel barrier layer 13, preferably, it is possible to use MgO, spinel ($MgAl_2O_4$), and aluminum oxide ($Al_2O_3$), and a thickness of the tunnel barrier layer 13 is in a range of about 0.8 nm to 3 nm. When $MgAl_2O_4$ and $Al_2O_3$ have a cubic structure, they may have a structure in which cation sites are disordered. It is preferable that the non-magnetic layer 13 is grown in the (001) orientation or a plane orientation equivalent thereto. Between the first perpendicular magnetization film layer 12 and the tunnel barrier layer 13, a layer made of a cubic material grown with the (001) plane orientation, for example, a cobalt (Co)-based full-Heusler alloy, a cobalt-iron (CoFe) alloy having a bcc structure, i.e. $Co_{1-x}Fe_x$ ($0 \leq x \leq 1$), may be interposed, for the purpose of improving magnetic properties of the first perpendicular magnetization film layer 12. The full-Heusler alloy has an $L2_1$ type structure and a chemical composition of $Co_2YZ$ (Y is transition metal, and Z is mainly a typical element). For X and Y atomic sites, for example, X is Fe, Cr, Mn, and an alloy thereof, and Y is Al, Si, Ge, Ga, Sn, and an alloy thereof. In addition to the $L2_1$ type structure as the form of the Co-based full-Heusler alloy, a B2 structure in which X and Y atomic sites are disordered may be used. In addition, a cobalt-iron-boron (CoFeB) alloy containing boron is also contained in the CoFe alloy.

The second perpendicular magnetization layer 14 can directly contact the tunnel barrier layer 13 and use a Co-based full Heusler alloy or a CoFe alloy that is the same as or the same kind as the first perpendicular magnetization layer 12. Also, in addition to this, a tetragonal material, for example, $L1_0$ type alloys XY (X=Fe, Co, Y=Pt, Pd), and $DO_{22}$ type or $L1_0$ type manganese-based alloys such as a manganese-gallium (Mn—Ga) alloy and a manganese-germanium (Mn—Ge) alloy, or the like can be applied to the second perpendicular magnetization layer 14 because it can be grown in a (001) orientation. Also, in this layer, a perpendicular magnetization film having an amorphous structure, for example, a terbium-cobalt-iron (Tb—Co—Fe) alloy film, may be included.

The upper electrode 15 is a metal protection layer formed on the second perpendicular magnetization layer 14. For example, preferably, it is possible to use Ta and Ru.

In the case of using a perpendicular magnetization film structure according to an embodiment of the present invention as a perpendicular magnetic recording medium, an underlayer and a perpendicular magnetization film layer are needed to be a thin film structure made of oriented nanocrystal grains. On a thermally-oxidized Si substrate or a glass substrate, a polycrystalline film of (001)-oriented MgO or $MgTiO_x$ can be fabricated by sputtering disposition, which can be used as an underlayer of the underlayer structure according to the present embodiment. For example, it is possible to use the thermally-oxidized Si substrate/MgO/Cr/ the perpendicular magnetization film structure.

(B) Manufacturing Method

Next, there will be described a manufacturing method of the perpendicular magnetization film structures 1 and 4, and the perpendicular MTJ element structure 9.

As a fabrication method of the perpendicular magnetization film 3, vapor deposition methods may be used. In particular, a radio frequency (RF) reactive sputter is preferably used. Instead of the radio frequency (RF) reactive sputter, it may be used other vapor deposition methods such as a DC reactive sputter, an electron beam evaporation, a simultaneous sputter of Mn and metal M, a simultaneous evaporation of Mn and metal M, a reactive evaporation or a reactive sputter using nitrogen radical source, a direct deposition using an Mn-M-N target in which a nitrogen composition is adjusted, and the like. A substrate temperature during the film deposition is preferably in a range from 200 to 700° C., more preferably 400 to 600° C. As a sputter process gas, it is possible to used inert gas such argon, krypton, neon, and xenon. A partial nitrogen gas pressure in the mixed gas of nitrogen and rare gas is preferably in a range of 0.1 to 3%, more preferably, of 0.5 to 2.5%, particularly preferably, of 0.7 to 2%. A film forming pressure is preferably in a range of 0.05 to 5 Pa, more preferably, of 0.1 to 1 Pa. A film forming time may be set appropriately according to a configuration of the used device, film forming conditions and the like. As the conditions such as kinds of target(s), it may be considered to use $Mn_{1-x}M_x$ alloy target, plural sources of Mn and metal M, Mn-M-N target in which a nitrogen composition is adjusted, and the like.

Figure 4:
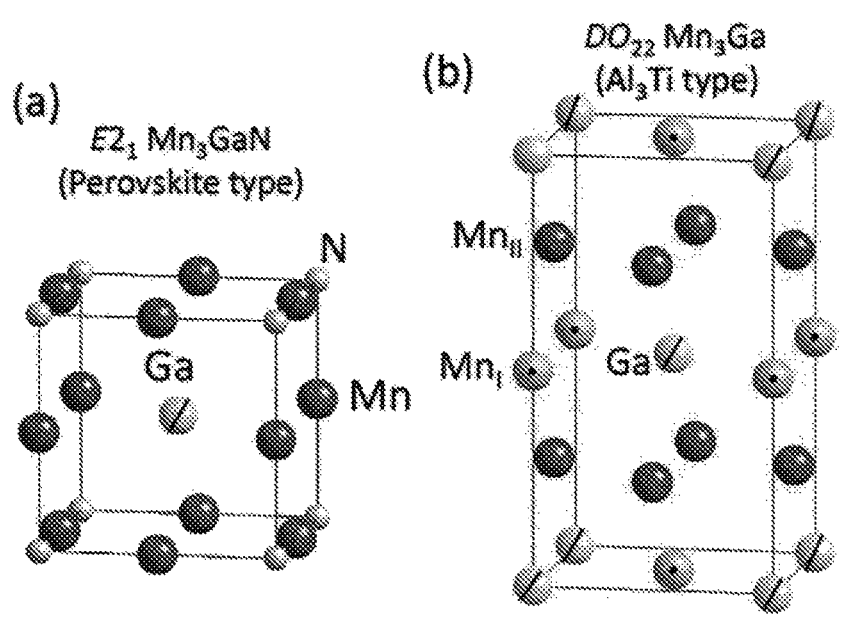
FIG. 4(a) is a schematic diagram illustrating a crystal structure of perovskite E2₁-Mn₃GaN and FIG. 4(b) is a schematic diagram illustrating a crystal structure of DO₂₂-Mn₃Ga.
Figure 5:
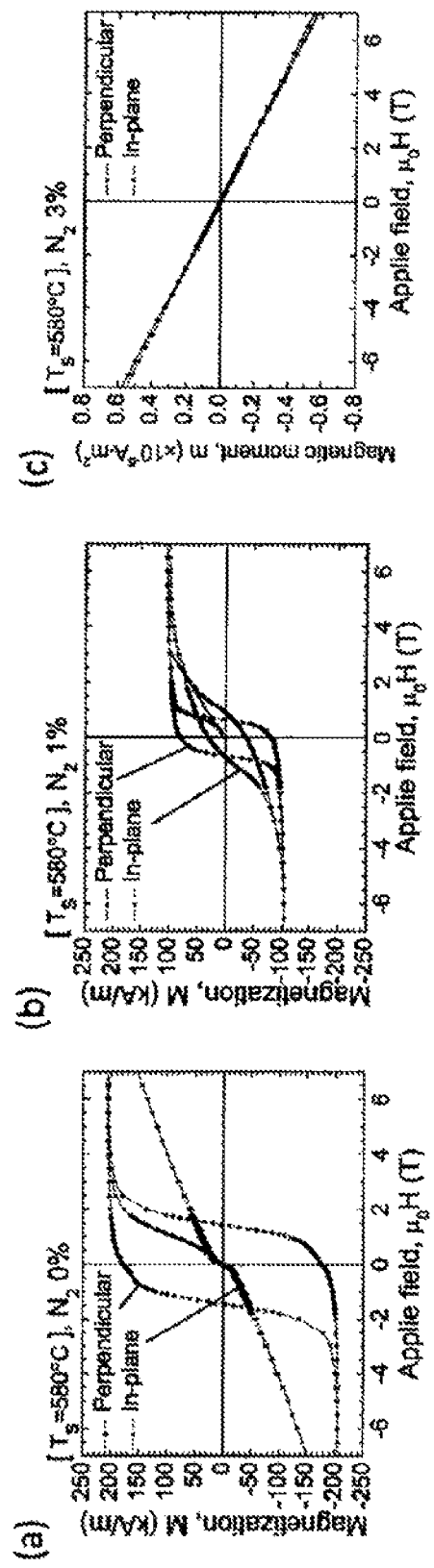
FIGS. 5(a) to 5(c) are diagrams of magnetization curves of 50-nm-thick films deposited on an MgO (001) substrate showing: (a) MnGa; (b) Mn—Ga—N (N₂ flow ratio 1%); and (c) Mn—Ga—N (N₂ flow ratio 3%).
Figure 6:
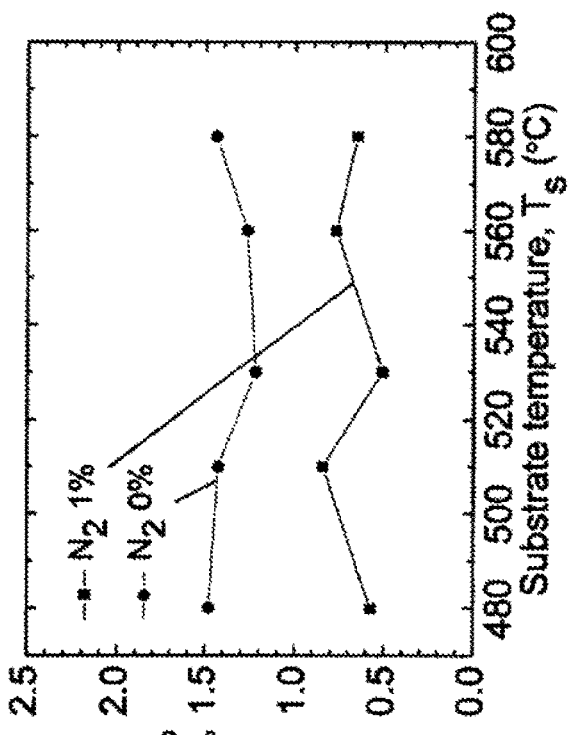
FIGS. 6(a) and 6(b) are diagrams showing substrate temperature ($T_s$) dependence of films for (a) saturation magnetization and (b) coercivity.
Figure 6:
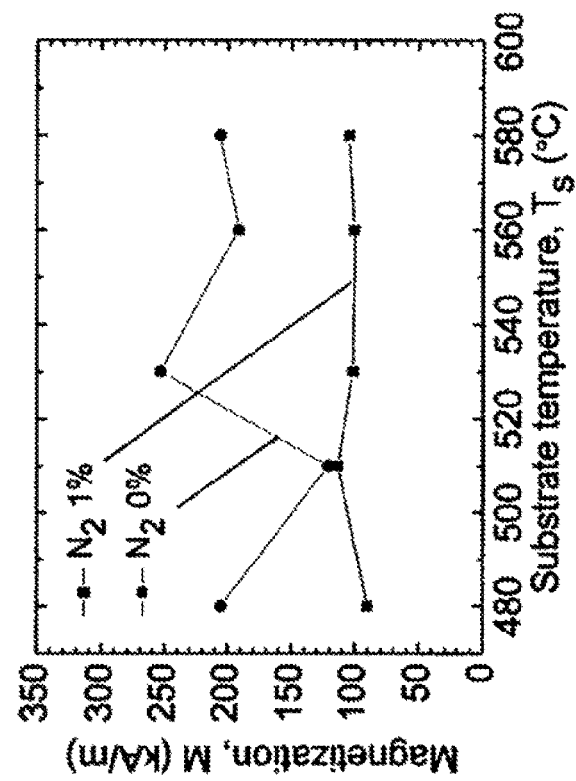

Here, an example of the fabrication method using Ga as metal M of the perpendicular magnetization film 3 will be described. As a fabrication method of the perpendicular magnetization film 3, film deposition is performed by radio frequency (RF) sputtering of an Mn—Ga alloy target, by using MgO having the (001) plane orientation as the substrate 2, using an ultra-high vacuum magnetron sputtering apparatus (a base pressure of about $4 \times 10^{-7}$ Pa), and using a process gas acquired by adding an argon gas and a nitrogen gas. As a composition of Mn—Ga, there is, for example, an element ratio of 70:30%. As a substrate temperature during the film deposition, a temperature range from 400 to 600° C. is used. A ratio of an argon gas pressure to a nitrogen gas pressure is adjusted in a range from 1 to 3%, and a total gas pressure is fixed to 0.27 Pa. In order to maintain an N composition to be smaller than a stoichiometric composition of an $E2_1$ type, the gas pressure and the substrate temperature are precisely determined. Due to this, it is possible to obtain a uniform and smooth Mn—Ga—N film with perpendicular magnetization of the present invention, which has an $E2_1$-$Mn_3GaN$ perovskite type crystal structure as shown in FIG. 4(a). A thickness of the Mn—Ga—N film is, for example, in a range from 5 to 50 nm, but may be thinner.

FIG. 4(b) shows a $DO_{22}$-$Mn_3Ga$ crystal structure.

As a fabrication method of the underlayers 6 and 11 in FIGS. 2 and 3, for example, the substrates 5 and 10 are used as the MgO substrate of the substrate 2, and Cr is deposited by using the same sputtering apparatus. A substrate temperature at the time of film deposition is room temperature, and pure argon gas is used as the process gas. As a gas pressure, for example, 0.13 Pa is used. Thereby, a Cr underlayer which is grown in a cubic structure and (001) orientation can be fabricated. In addition, it is possible to control flatness and a crystal structure by performing a post annealing treatment at 200 to 800° C. in a vacuum after formation of the Cr layer. The perpendicular magnetization films 7 and 12 can be fabricated by using the method as the perpendicular magnetization film 3.

Next, in the structure of FIG. 3, an MgO layer is formed to have a thickness of, for example, 1 to 2 nm, on the fabricated Mn—Ga—N film, as the tunnel barrier layer 13. To form the MgO film, it is possible to use direct RF sputter deposition from the MgO target, or a method of oxidization of a sputter-deposited magnesium (Mg) metal. After formation of the MgO layer, it is possible to improve a crystal quality and (001) orientation by performing a post annealing treatment at about 200° C. Therefore, a higher tunnel magnetoresistance (TMR) ratio is acquired.

Thereafter, as the second perpendicular magnetization film layer 14, for example, a CoFeB amorphous layer is formed by sputter deposition, and a thickness thereof is set to be, for example, 1.3 nm. As the upper electrode 15, laminated layers of Ta having a thickness of, for example, 5 nm and a Ru layer having a thickness of, for example, 10 nm are formed by sputter deposition. Boron (B) of the Co—Fe—B layer is interdiffused into a Ta layer due to annealing treatment, and therefore, the B concentration thereof is reduced. Thereby, crystallization of the Co—Fe—B layer occurs from the side of the MgO tunnel barrier layer and the layer transforms into a bcc structure having a (001) plane orientation. Thereby, the structure of the first perpendicular magnetization film layer 12/the tunnel barrier layer 13/the second perpendicular magnetization film layer 14 aligns with the (001) crystal orientation, thereby obtaining a high TMR ratio. In order to promote the crystallization, it is possible to insert a crystalline CoFe layer between the MgO layer and the CoFeB layer with 0.1 to 0.5 nm.

Next, as the upper electrode 15, for example, Ta (about 0.5 to 10 nm) and Ru (about 2 to 20 nm), or Ta/Ru laminated films are disposed by a sputter method at room temperature.

By appropriately performing annealing treatment on the fabricated multilayer film structure, TMR properties are improved. Finally, the multilayer film structure is patterned into a pillar element shape by a typical microfabrication techniques using electron-beam lithography, photolithography, ion etching, or the like, thereby forming a structure of which electrical transport characteristics are evaluable.

Next, an embodiment is illustrated, and a perpendicular magnetization film and characteristics of a perpendicular MTJ element structure using the perpendicular magnetization film according to an embodiment of the present invention will be described with reference to FIGS. 5 to 15.

Example 1

Magnetic Properties

Magnetic properties of the Mn—Ga—N film which is fabricated on the MgO substrate according to the above-described (B) manufacturing method will be described. FIGS. 5(a), 5(b), and 5(c), illustrate magnetization curves of MnGa (N) films which are fabricated through a sputter method using MgO (001) as a substrate, a design thickness of 50 nm, a substrate temperature of Ts=580° C., and an $Mn_{70}Ga_{30}$ target in the structure of FIG. 1. In this case, In-plane and Perpendicular refer to what are measured when an external magnetic field $\mu_0H$ is applied respectively in an in-plane direction and a perpendicular direction of the films. FIGS. 5(a) and 5(b) illustrate examples in which an Mn—Ga—(—N) thin film is sputter-fabricated from the MnGa target respectively under conditions of a nitrogen gas ratio of 0% (there is no nitrogen introduction) and a nitrogen gas ratio of 1%. They correspond to magnetization curves of an Mn—Ga—(N) film alone, from which a background signal from the substrate is removed. The both films clearly represent a magnetic hysteresis with a high squareness when a film perpendicular magnetic field is applied. On the other hand, it can be seen that it is difficult to saturate the magnetization when an in-plane magnetic field is applied. Therefore, their behavior shows formation of a perpendicular magnetization film in which a film perpendicular direction is a magnetic easy axis. FIG. 5(c) shows an example in which the Mn—Ga—N thin film is sputter-fabricated from the Mn—Ga target under a condition of a nitrogen gas ratio of 3%. In this drawing, a background signal from the substrate is not removed. There is no obvious difference between the magnetization curve in the in-plane direction and the magnetization curve in the plane perpendicular direction, and a magnetic hysteresis is not seen unlike a case in which the nitrogen gas ratio is lower. Therefore, it shows that transition from ferromagnetic to antiferromagnetic occurs due to an increase in a nitrogen amount of the Mn—Ga—N.

FIG. 6(a) shows changes in saturation magnetization of the Mn—Ga film (a nitrogen gas ratio of 0%) and the Mn—Ga—N film (a nitrogen gas ratio of 1%) due to a substrate temperature Ts. The Mn—Ga film shows magnetization of approximately 200 to 250 kA/m, although there is a variation due to a change of the temperature. On the other hand, magnetization of the Mn—Ga—N film (the nitrogen gas ratio of 1%) is approximately constant, which is about 100 kA/m, regardless of Ts. Also, it is possible to halve the saturation magnetization from Mn—Ga while maintaining perpendicular magnetization characteristics. The saturation magnetization is equal to or less than one-tenth, as compared to a CoFeB (1000 to 1800 kA/m), a CoFe alloy (1400 to 2000 kA/m), a Co-based Heusler alloy (800 to 1100 kA/m), and FePt (1000 to 1200 kA/m), which are existing materials.

FIG. 6(b) shows changes in coercivity of the Mn—Ga film (a nitrogen gas ratio of 0%) and the Mn—Ga—N film (a nitrogen gas ratio of 1%) as a function of a substrate temperature Ts. Both of the Mn—Ga film and the Mn—Ga—N film (nitrogen gas ratio of 1%) have small dependence on Ts, and respectively have coercivity of about 1.2 T and coercivity of about 0.6 T. Therefore, it is possible to maintain high coercivity sufficiently as a perpendicular magnetization film of the perpendicular MTJ element even in the Mn—Ga—N film.

Figure 7:
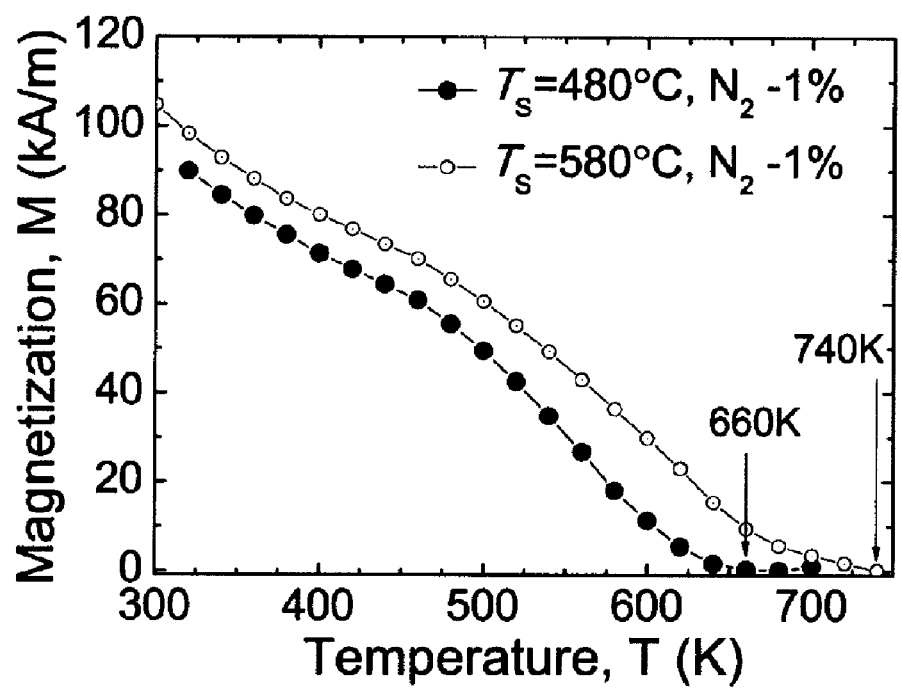
FIG. 7 shows measurement temperature dependence of saturation magnetizations above room temperature in cases for the films with $T_s$ of 480° C. and 580° C.
Figure 8:
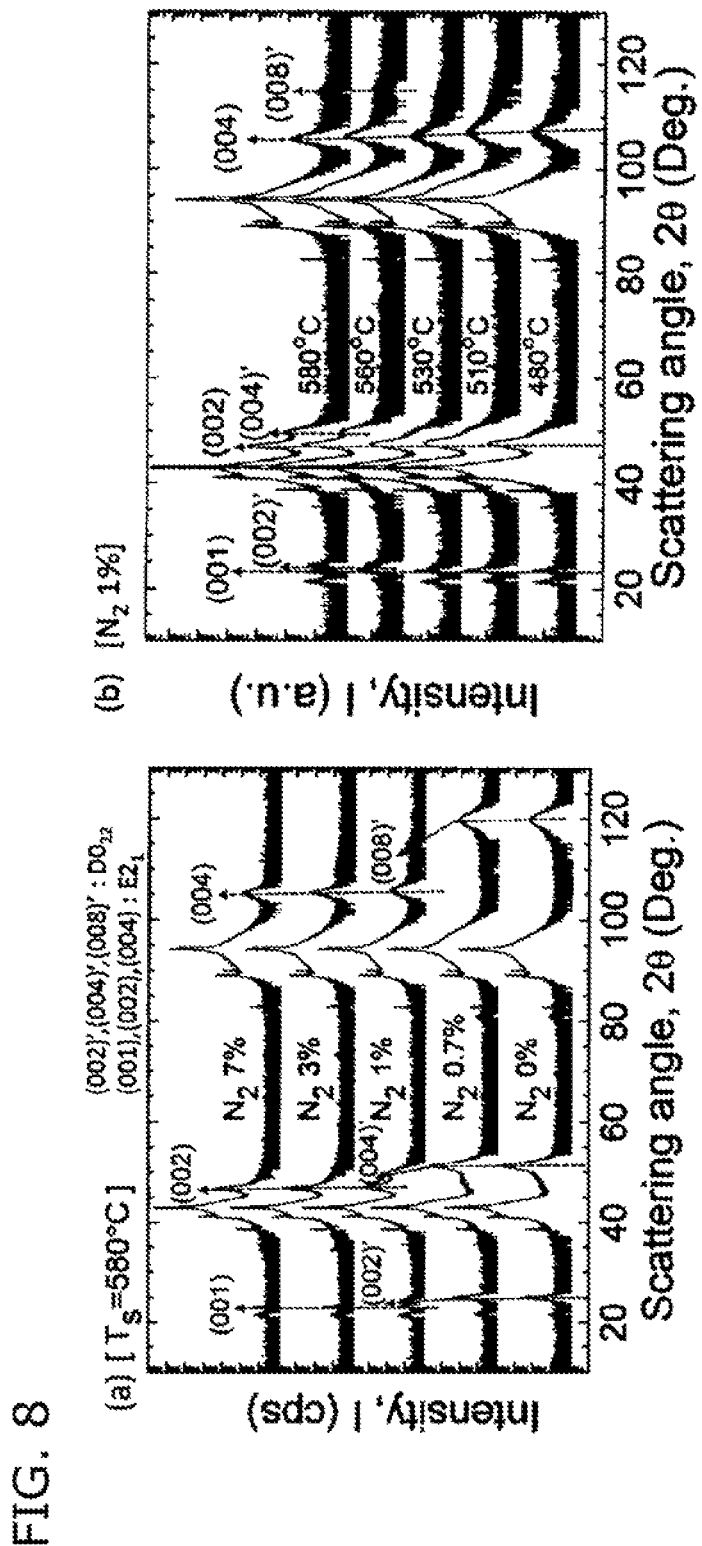
FIGS. 8(a) and 8(b) show X-ray diffraction (XRD) profiles in cases of (a) at a temperature $T_s$ of (a) 580° C. and (b) a N₂ gas flow ratio of 1%.

FIG. 7 shows measurement temperature dependence above room temperature of saturation magnetization of the Mn—Ga—N film fabricated using a nitrogen gas ratio of 1%, and Ts=480° C. or 580° C. In the both Ts cases, saturation magnetization monotonically decreases with increasing the measurement temperature, and a rapid change in saturation magnetization due to crystal structure transformation or decomposition by the elevated temperature does not appear. Also, at Ts=480° C. and 580° C., respective Curie temperatures are estimated as 660 K and 740 K. The values are applicable as a perpendicular magnetization film of the perpendicular MTJ element which is sufficiently higher than room temperature.

(Crystal Structure)

Next, a crystal structure of the Mn—Ga—N film having the structure of FIG. 1 will be described with reference to FIGS. 8(a), 8(b), 9 and 10. FIGS. 8(a) and 8(b) show a result of X-ray diffraction profiles (out-of-plane scans) of the Mn—Ga (—N) films (thickness of 50 nm) which are fabricated at a temperature of Ts=580° C. while a nitrogen gas ratio is changed from 0 to 7%. In this case, indexes (001), (002), and (004) represent peaks due to a perovskite $E2_1$ structure, and (002)', (004)', and (008)' represent peaks due to a $DO_{22}$ structure. When a nitrogen gas ratio is equal to or less than 0.7%, the structure of the Mn—Ga (—N) film is almost $DO_{22}$, but when a nitrogen gas ratio is equal to or greater than 1%, the structure suddenly transforms into an $E2_1$ type structure. Also, it can be known that any Mn—Ga (—N) film is grown in a (001) orientation.

FIG. 8(b) shows a result of X-ray diffraction profiles (out-of-plane scans) of the Mn—Ga—N films (thickness of 50 nm) which are fabricated at a nitrogen gas ratio of 1% while a substrate temperature Ts is changed from 480° C. to 580° C. At Ts=480° C., the $E2_1$ structure is nearly acquired as a single phase. A peak due to the $DO_{22}$ structure appears due to an increase in Ts, and therefore, it is seen that the peak intensity increases. Therefore, it can be seen that, at high Ts, a $DO_{22}$ structure partly coexist with the $E2_1$ structure.

Figure 9:
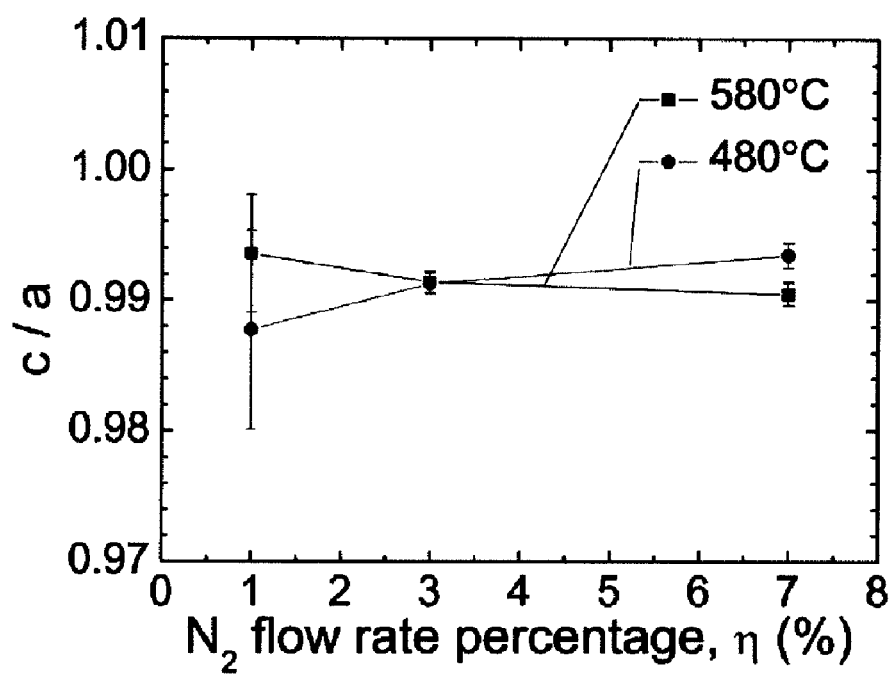
FIG. 9 shows changes of a c/a ratio of an E2₁ structure in a case for $T_s$ of 480° C. and 580° C. as a function of the flow ratio of N₂ gas.
Figure 10:
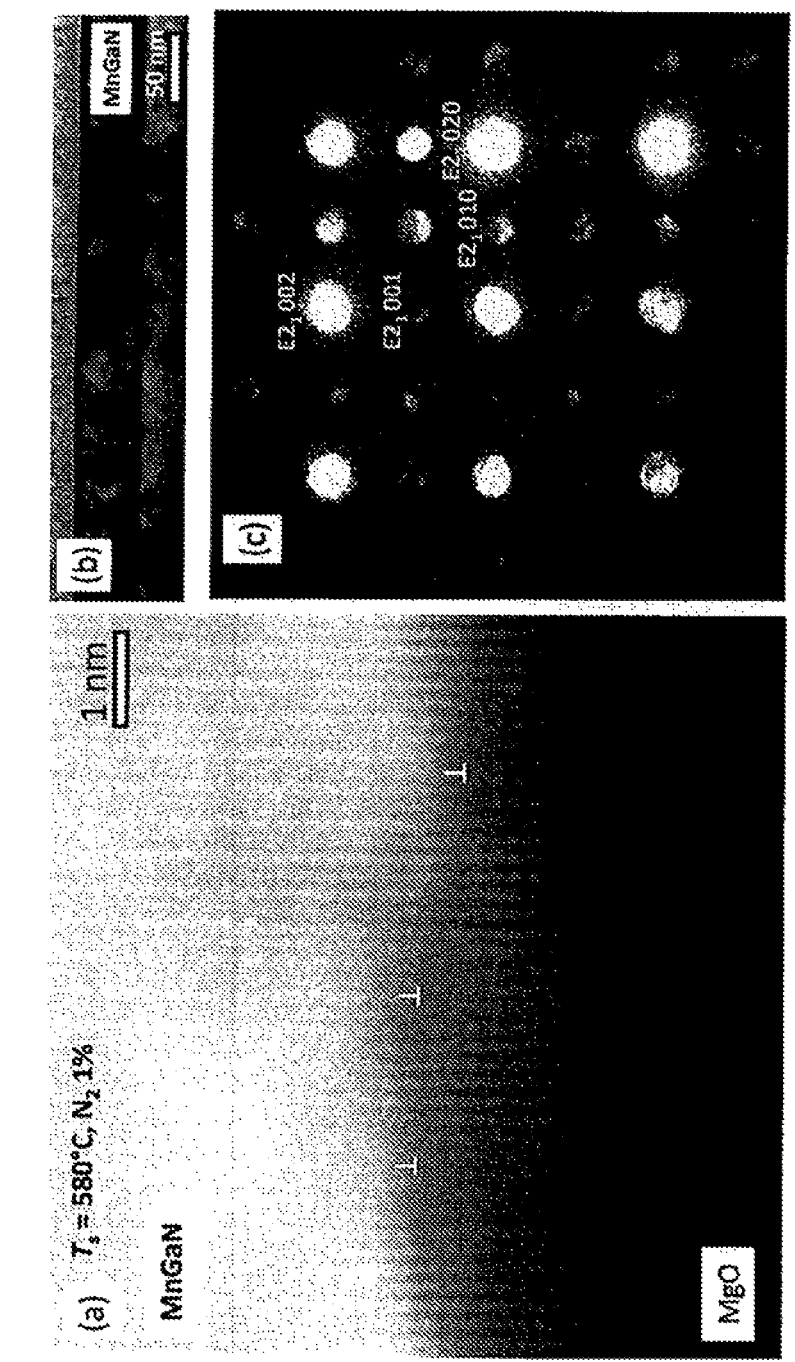
FIG. 10 is a diagram showing (a) a high-resolution HAADF-STEM image of a cross section at the vicinity of an interface of an MgO substrate, (b) a HAADF-STEM image obtained by observing a wide area of the thin film, and (c) a nano-electron beam diffraction image.

FIG. 9 shows a c/a ratio of films for an $E2_1$ structure using Ts=480° C. and 580° C. as a function of a nitrogen gas ratio. In this case, the c/a ratio is acquired by normalizing a lattice constant (a) in a perpendicular direction into a lattice constant (c) in an in-plane direction. Since c/a<1 is obtained in any cases, it can be seen that the structure is compressed in the perpendicular direction from the $E2_1$ structure, and therefore, this means not a perfect cubic structure.

FIG. 10(a) shows a high-resolution high-angle-annular-dark-field (HAADF)—scanning transmission electron microscope (STEM) image of a cross section at the vicinity of an interface of the MgO substrate of the Mn—Ga—N film fabricated at Ts=580° C. and a nitrogen gas ratio of 1%. An observation direction is the Mn-G-N [100] direction. The MnGaN layer is epitaxially grown from the MgO substrate and is grown in the (001) orientation, similarly as a result of X-ray diffraction. A reference symbol ⊥ shows a misfit dislocation. Since a lattice constant of MnGaN is smaller than that of MgO, such misfit dislocations are introduced. FIG. 10(b) shows an HAADF-STEM image that is observed in a wide area of the thin film and it can be seen that surface flatness of the thin film is high. FIG. 10(c) shows a nano-electron beam diffraction image (NBD image). Due to this approach, the crystal structure of a fine area of nanometer scale can be revealed. The same image is acquired in the almost entire area of the Mn—Ga—N film, and thus it is obviously known that the Mn—Ga—N film has an $E2_1$ structure.

Also, as a result of performance of element mapping by energy dispersive X-ray spectroscopy (EDS) on the cross section of the Mn—Ga—N film fabricated at Ts=480° C. and a nitrogen gas ratio of 1%, respective elements of Mn, Ga, and N are homogeneously distributed, and a composition thereof is estimated as $Mn_{57}Ga_{32}N_{11}$. This composition corresponds to M=Ga, x=0.360, and y=0.506 in $(Mn_{1-x}M_x)_4 N_{1-y}$. Therefore, it can be obviously seen that, even in a case in which the N element ratio is about a half of 20% that is a stoichiometric composition of the $Mn_3GaN$, the $E2_1$ structure is stably acquired. Also, the homogeneous N distribution obviously causes a conclusion that the observed spontaneous magnetization is resulted from the nitrogen-deficient composition of the MnGaN itself, not formation of a secondary-phase.

(Surface Structure)

Figure 11:
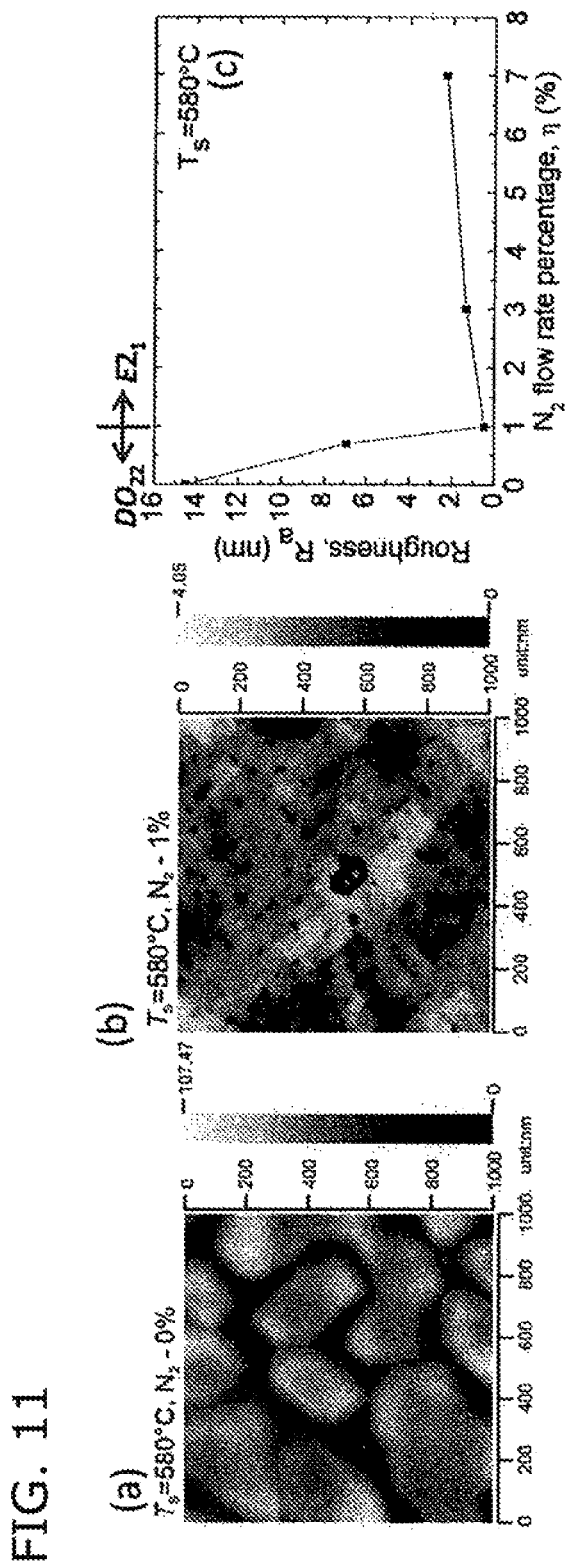
FIG. 11 is a diagram showing AFM images of 50-nm-thick (a) Mn—Ga film (N₂ of 0%) and (b) Mn—Ga—N film (N₂ of 1%), and (c) N₂ gas flow rate dependence of an average roughness Ra.

Next, a surface structure of the Mn—Ga—N film will be described with reference to FIG. 11. FIGS. 11(a) and (b) respectively show atomic force microscope (AFM) images of an Mn—Ga film (a nitrogen gas ratio of 0%) and an Mn—Ga—N film (a nitrogen gas ratio of 1%). Fabrication is performed under conditions of both a film thickness of 50 nm and Ts=580° C. Since the Mn—Ga film has very bad flatness and crystal grain growth is noticeable, a continuous film is not acquired. Since maximum undulation is equal to or larger than 100 nm in a square area of 1 μm, it is unsuitable as the perpendicular magnetization film of the MTJ element. On the other hand, the Mn—Ga—N film (nitrogen gas ratio of 1%) is very flat and maximum undulation is just about 4 nm. FIG. 11(c) shows nitrogen dependence of the average roughness Ra for the Mn—Ga (—N) film fabricated at Ts=580° C. It can be known that, near the nitrogen gas ratio of 1%, transformation from the $DO_{22}$ structure into the $E2_1$ structure occurs, and, at the same time, Ra is extremely reduced. Due to a further increase in the nitrogen gas ratio, Ra slowly increases, but is still sufficiently low as compared to a nitrogen gas ratio of not more than 0.7%. As a result, since flattening is significantly promoted due to nitrogen introduction, the Mn—Ga—N thin film of which the nitrogen gas ratio is adjusted is suitable as the perpendicular magnetization film for the MTJ element.

(Spin Polarization Characteristics)

Figure 12:
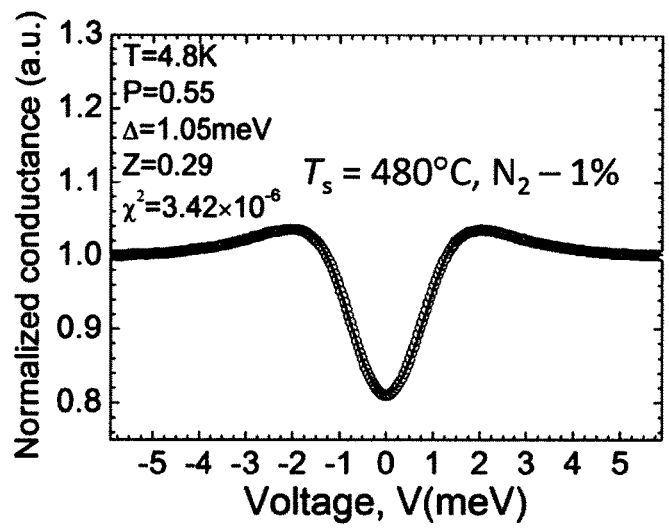
FIG. 12 is a diagram showing bias voltage dependence of electrical conductance of a 50-nm-thick Mn—Ga—N film, fabricated at $T_s$ of 480° C. and an N₂ gas flow ratio of 1%.
Figure 13:
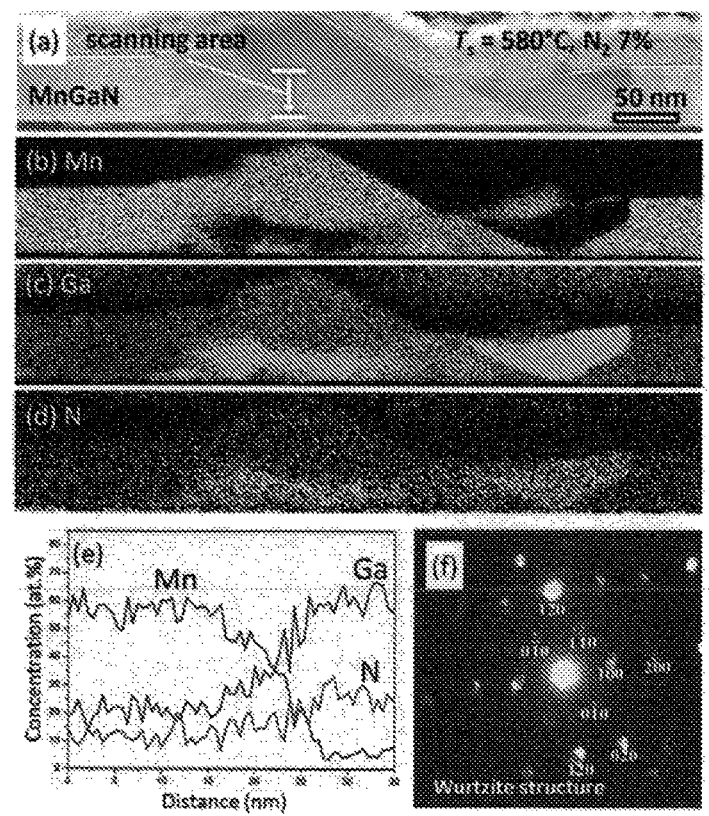
FIGS. 13(a) to 13(f) are diagrams showing: (a) an HAADF-STEM image in the case of Mn—Ga—N (N₂ flow ratio 7%); (b), (c), and (d) EDS element maps (Mn, Ga, and N, respectively) in the same portion as in (a); (e) an element profile of a portion indicated by "scanning area"; and (f) an nano-electron beam diffraction image.

Next, a spin polarization of the Mn—Ga—N film will be described with reference to FIG. 12. The tunnel resistance of the MTJ element is changed by relative magnetization directions of two ferromagnetic substances, and the resistance change rate thereof is referred to as a tunnel magnetoresistance (TMR) ratio. Since the TMR ratio is an output index of the MTJ element, it is important to acquire a high value. As the spin polarization, that is a ratio of density of states of an up-spin band and a down-spin band at a Fermi level of the ferromagnetic substances increases, the TMR ratio increases. The spin polarization of the ferromagnetic substance at liquid helium temperature is capable of being evaluated by a point contact Andreev-reflection spectroscopy (PCAR). This technique uses Andreev-reflection occurring at a point contact between a conductor and a superconductor. The spin polarization is obtained by contacting a niobium (Nb) needle, which is in a super conductive state, against a surface of the ferromagnetic substance and measuring bias-voltage dependence of conductance. FIG. 12 shows bias voltage dependence of conductance of the 50-nm-thick Mn—Ga—N film fabricated using Ts=480° C. and a nitrogen gas ratio of 1%. A scattering factor Z, a superconductive gap $\Delta$, and the spin polarization P are calculated by performing fitting of the value near zero bias voltage by a formula for analysis of Andreev-reflection. The intrinsic spin polarization of a sample is set by performing a plurality of measurements and extrapolating P to Z=0. Due to the analysis, a spin polarization of 57% is obtained in the Mn—Ga—N thin film. A relatively high spin polarization is maintained and the value is almost identical to a value 58% acquired from the $DO_{22}$-Mn—Ga thin film containing no nitrogen. Therefore, it is obvious that the Mn—Ga—N is applicable as a ferromagnetic electrode for the perpendicular MTJ.

Comparative Example 1

Subsequently, a crystal structure of an Mn—Ga—N film that does not exhibit ferromagnetic characteristics will be described with reference to FIGS. 13(a) to 13(f). As shown in FIG. 5(c), the Mn—Ga—N thin film, which is fabricated under a condition of a nitrogen gas ratio of equal to or higher than 3%, does not show ferromagnetic hysteresis. Therefore, it is regarded that ferromagnetic characteristics are lost due to an increase in amount of nitrogen in an Mn—Ga—N thin film and there occurs magnetic transformation into the same anti-ferromagnetic characteristics or non-magnetic characteristics as $Mn_3GaN$ bulk. According to analysis by EDS the nitrogen composition of the Mn—Ga—N thin film that exhibits anti-ferromagnetic characteristics is close to 15 to 20% and a stoichiometric composition. Thus, in the case under a condition of a nitrogen gas ratio of equal to or higher than 3%, the y value in $(Mn_{1-x}M_x)_4N_{1-y}$ is almost zero. This composition is definitely much as compared to an Mn—Ga—N thin film that exhibits ferromagnetic characteristics. Also, it is seen from FIG. 11(c) that an average roughness Ra slowly rises with increasing nitrogen gas ratio. Therefore, as an comparative example, there will be described secondary phase precipitation observed in a surface of an Mn—Ga—N thin film having a thickness of 50 nm, which is fabricated by using the same manufacturing method as in Example 1, at a nitrogen gas ratio of 7% and a substrate temperature Ts=580° C. A continuous film structure which is nearly flat is acquired even for a thin film of 7%. However, it is seen that an increase in Ra is seen due to appearance of a portion of area which disturbs flatness according to an increase in a nitrogen gas ratio. FIGS. 13(a) to 13(f) show HAADF-STEM images in an area that disturbs flatness. In FIGS. 13(b) to 13(d), there are illustrated element maps (respectively, Mn, Ga, and N) using EDS in the same portion as FIG. 13(a). Bright portions represent that many elements are contained with respect to each element. Also, FIG. 13(e) shows profiles of respective elements Mn, Ga, and N in an area indicated by "Scanning area". It can be seen from the drawing that secondary phase, which does not contain Mn but is configured by Ga and N, is formed at the side of an MgO substrate in the area that disturbs flatness. Existence of a Wurtzite structure Ga—N (non-magnetic) belonging to a hexagonal system is confirmed from a nano-electron beam diffraction image of the portion (FIG. 13(f)). Thus, the Mn—Ga—N film having excessive nitrogen is not a single phase; Ga—N exists as the second phase, which degrades film flatness. Also, a volume fraction of the Ga—N layer is small, and in the X-ray diffraction profiles of FIGS. 8(a) and 8(b), a peak due to Ga—N is not observed.

Example 2

Figure 14:
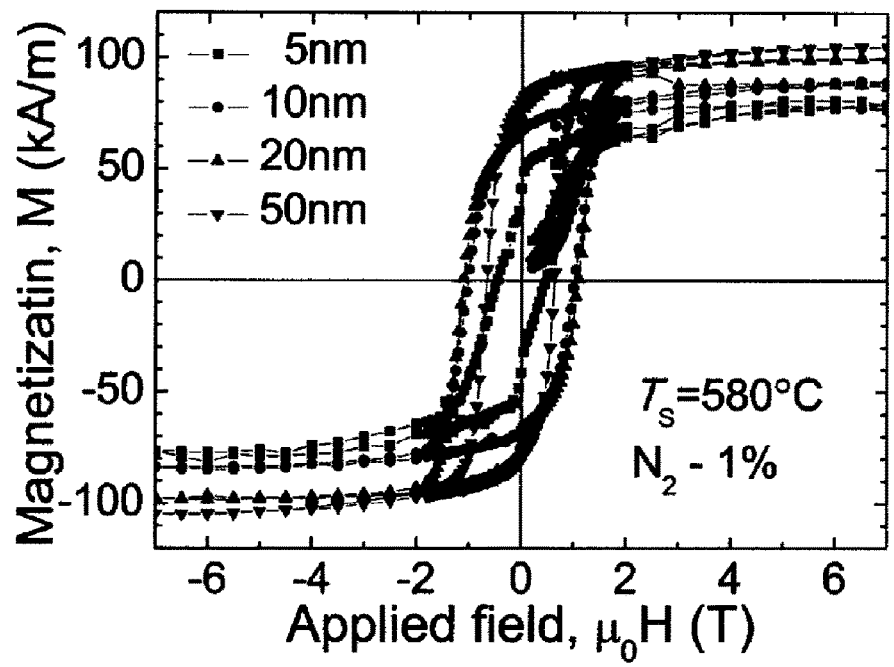
FIG. 14 is a diagram showing magnetization curves in a film perpendicular direction in a case of films with various thicknesses.

By using the same method as in Example 1, a thickness of the Mn—Ga—N thin film is changed. FIG. 14 show magnetization curves in a film perpendicular direction at room temperature in a case in which a substrate temperature Ts=580° C. and a nitrogen gas ratio of 1% are fixed, and a thickness of the Mn—Ga—N film is set to 5, 10, 20 and 50 nm. It can be seen that a perpendicular magnetization characteristic is acquired even when down to 5 nm, and saturation magnetization is maintained at a value of 80% as compared to a value of 50 nm. Therefore, the ferromagnetic Mn—Ga—N film can be made to be thinned and is suitable as a ferromagnetic layer of the perpendicular MTJ element.

Example 3

Figure 15:
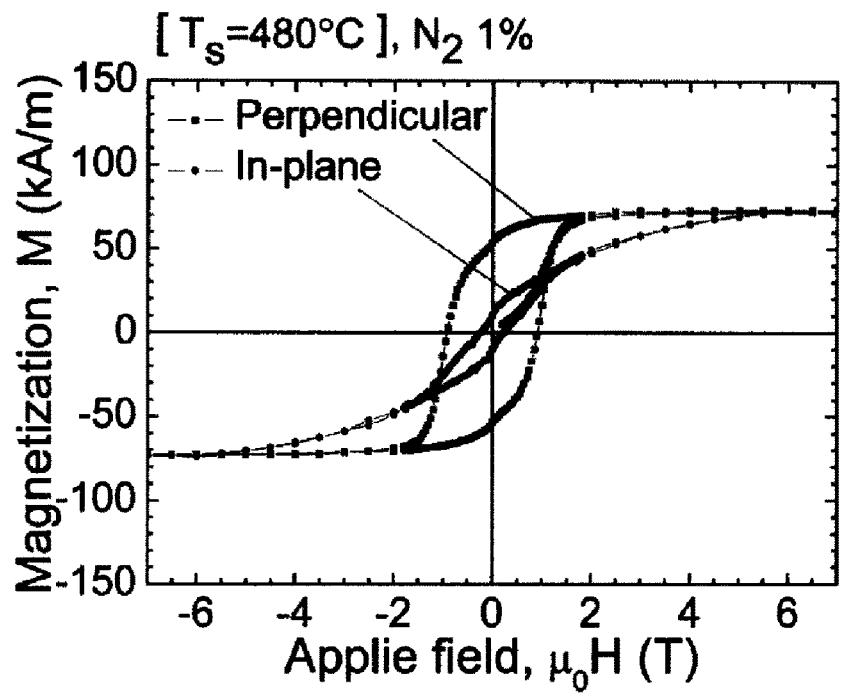
FIG. 15 is a diagram showing a magnetization curve of a film with a Cr underlayer.

As the structure of FIGS. 2 and 3, the Mn—Ga—N thin film is fabricated by using the same method as in Example 1 except that a Cr layer of 40 nm on an MgO substrate is used as a buffer layer. FIG. 15 shows magnetization curves in in-plane and perpendicular directions of the Mn—Ga—N film at room temperature, the Mn—Ga—N film having a thickness of 50 nm and being fabricated at a substrate temperature of Ts=480° C. and a nitrogen gas ratio of 1%. It is obvious from the magnetization curves that the perpendicular magnetization Mn—Ga—N film is acquired even in a case of using Cr as the buffer layer. Therefore, it is possible to use the metal Cr layer as a non-magnetic lower electrode of the Mn—Ga—N film, and to configure the MTJ element by using it.

Example 4

As the structure of FIG. 3, the perpendicular magnetization MTJ element is fabricated based on the (B) manufacturing method. For the element structure, the lower electrode was MgO substrate/Mn—Ga—N (substrate temperature Ts=480° C., nitrogen gas ratio 1%) 50 nm/Mg (0.6 nm)/MgO (1.8 nm)/Fe (0.1 nm)/CoFeB (1.3 nm)/Ta (2 nm)/Ru (15 nm). In this case, an Mg/MgO structure is the tunnel barrier layer 13, an Fe/CoFeB structure is the second perpendicular magnetization film layer 14 and a Ta/Ru structure is the upper electrode 15. Since each thickness and film disposition conditions of the respective Mg, MgO, Fe, and CoFeB layers are optimized to show perpendicular magnetization for the Fe/CoFeB layer, a condition that the first perpendicular magnetization layer (Mn—Ga—N layer) and the second perpendicular magnetization layer (Fe/CoFeB) are perpendicular to each other is satisfied, and the perpendicular magnetization MTJ element is formed. In the perpendicular magnetization MTJ element, it is proved that a TMR ratio of 4% at room temperature is acquired, and the Mn—Ga—N layer functions as a ferromagnetic electrode of the perpendicular MTJ element.

As it is seen from the descriptions of Examples 1 to 4, it is confirmed that the Mn—Ga—N perpendicular magnetization film is homogeneously formed in nitrogen-deficient composition through adjustment of a substrate temperature and a nitrogen gas ratio during fabrication. Due to this feature, it is possible to exhibit a Curie temperature that is higher than room temperature, have saturation magnetization smaller than that of existing materials, and form a vary flat film, and therefore, it is possible to maintain high spin polarization. Therefore, the nitrogen-deficient Mn—Ga—N film is suitable as the perpendicular magnetization film for the perpendicular MTJ element.

INDUSTRIAL APPLICABILITY

The perpendicular magnetization film according to the present invention can be used for a ferromagnetic electrode for a perpendicular MTJ element for high-density STT-MRAM. Furthermore, the perpendicular magnetization film according to the present invention can be used as a perpendicular magnetic recording medium, and is suitable to be used for a perpendicular magnetic recording disk mounted in a magnetic disk device, such as HDD in particular. Also, the perpendicular magnetization film according to the present invention can be preferably used as a discrete track medium (DTM) or a bit-patterned media (BPM) which is promising as a medium that realizes ultra-high recording density which is higher than the information recording density of an existing perpendicular magnetic recording medium, or as a heat assist magnetic recording medium that is capable of archiving ultra-high recording density which is higher than information recording density due to a perpendicular magnetic recording method.

DESCRIPTION OF REFERENCE SYMBOLS 1, 4 Perpendicular magnetization film structure
2, 5, 10 Substrate
3, 7 Perpendicular magnetization film
6, 11 Underlayer
8, 14 Non-magnetic layer
9 Perpendicular MTJ element structure
12 First perpendicular magnetization film layer
14 Second perpendicular magnetization film layer
15 Upper electrode

The invention claimed is:

1. A perpendicular magnetization film having a composition consisting essentially of $(Mn_{1-x}M_x)_4N_{1-y}$ wherein M is selected from the group consisting of Ga, Ge, Zn, Sb, Ni, Ag, and Pt, and mixtures thereof, and wherein $0<x\leq0.5$ and $0<y<1$,
and a perovskite type crystal structure.

2. The perpendicular magnetization film according to 1, wherein the metal element M is Ga or Ge.

3. The perpendicular magnetization film according to claim 1, wherein vapor deposition is made on a substrate or through an underlayer on a substrate.

4. A perpendicular magnetization film structure having a structure in which the perpendicular magnetization film according to claim 1 is laminated on the substrate or through the underlayer on the substrate.

5. The perpendicular magnetization film structure according to claim 4, wherein the substrate is a single crystal substrate with a cubic structure grown in an (001) orientation or an orientation film with a cubic structure which is grown in the (001) orientation.

6. The perpendicular magnetization film structure according to claim 4, wherein the underlayer is a nonmagnetic layer or an electric conductive layer and is made through single crystal growth.

7. The perpendicular magnetization film structure according to claim 4, wherein a non-magnetic layer is laminated on the perpendicular magnetization film in a perpendicular magnetization film structure.

8. A perpendicular tunnel magnetoresistance (MTJ) element structure comprising:
the perpendicular magnetization film in the perpendicular magnetization film structure according to claim 4 being used as a first perpendicular magnetization layer, a tunnel barrier layer thereon; and
a perpendicular magnetization layer which is the same type as or different type from the perpendicular magnetization film being laminated as a second perpendicular magnetization layer.

9. The perpendicular tunnel magnetoresistance (MTJ) element structure according to claim 8, wherein the element structure has an upper electrode on the second perpendicular magnetization film layer.

10. A perpendicular magnetic recording medium including the perpendicular magnetization film structure according to claim 4, being at least of a part thereof.

11. A fabrication method of a perpendicular magnetization film, wherein the perpendicular magnetization film having the composition expressed in claim 1, is formed on a substrate by a vapor deposition method.

12. The fabrication method of a perpendicular magnetization film according to claim 11, wherein the vapor deposition method is a radio frequency (RF) reactive sputter, a DC reactive sputter, an electron beam evaporation, a simultaneous sputter of Mn and metal M, a simultaneous evaporation of Mn and metal M, a reactive evaporation or a reactive sputter using nitrogen radical source, or a direct deposition using an Mn-M-N target in which a nitrogen composition is adjusted.

* * * * *